(12) United States Patent
Ishii

(10) Patent No.: US 6,847,226 B2
(45) Date of Patent: Jan. 25, 2005

(54) SEMICONDUCTOR INSTRUMENT (75) Inventor: Motonori Ishii, Takatsuki (JP)

(73) Assignee: Matsushita Electric Industrial Co., Ltd. (JP)

( * ) Notice: Subject to any disclaimer, the term of this patent is extended or adjusted under 35 U.S.C. 154(b) by 130 days.

(21) Appl. No.: 10/314,402

(22) Filed: Dec. 9, 2002

(65) Prior Publication Data
US 2003/0116809 A1 Jun. 26, 2003

(30) Foreign Application Priority Data
Dec. 10, 2001 (JP) ........................................ 2001-375095

(51) Int. Cl.⁷ .......................................... H01Q 19/003
(52) U.S. Cl. .......................... 326/33; 326/27; 257/390
(58) Field of Search ................................ 257/390, 391; 326/33, 81, 83, 27, 34

(56) References Cited

U.S. PATENT DOCUMENTS

| | | | | |
|---|---|---|---|---|
| 4,999,519 A | * | 3/1991 | Kitsukawa et al. | 326/110 |
| 5,391,939 A | * | 2/1995 | Nonaka | 326/63 |
| 5,570,038 A | * | 10/1996 | Makino et al. | 326/33 |
| 5,726,589 A | * | 3/1998 | Cahill et al. | 326/81 |
| 5,955,891 A | * | 9/1999 | Makino et al. | 326/33 |
| 6,441,679 B1 | * | 8/2002 | Ohshima | 327/538 |

* cited by examiner

Primary Examiner—Tho Phan
(74) Attorney, Agent, or Firm—Parkhurst & Wendel, L.L.P.

(57) ABSTRACT

To provide a semiconductor instrument for improving power added efficiency when a low power is outputted. In the semiconductor instrument in which a radio-frequency input signal ($S_{RF}$) is supplied to input circuits of a plurality of transistors (1, 2), output circuits of the plurality of transistors (1, 2) are connected in parallel, and a radio-frequency output signal amplified with power is retrieved an amplifying operation of one part transistor (2) of the plurality of the transistors (1, 2) is turned off during a low-output operation.

5 Claims, 7 Drawing Sheets

SEMICONDUCTOR INSTRUMENT

FIELD OF THE INVENTION

Among semiconductor instruments for amplifying radio-frequency power, the present invention relates to a semiconductor instrument in which a plurality of transistors have output circuits connected in parallel to amplify power and retrieve a radio-frequency output signal.

BACKGROUND OF THE INVENTION

Semiconductor instruments have been mainly used for transmission parts of radio communication equipment such as mobile phones using radio-frequency waves and for amplifying radio-frequency signals to defined power necessary for conducting communication with wireless base stations.

As to mobile phones, longtime continuous conversation has been demanded in general. In order to realize longtime continuous conversation, a battery needs to have a power supply with a large capacity and power consumption needs to be low in an internal circuit of a mobile phone during a telephone conversation.

An electromagnetic wave is continuously transmitted to a base station during a conversation of a mobile phone. The transmission power is different depending on a communication method and a use condition of the mobile phone and increases up to about 4W. A component called a power amplifier in the mobile phone amplifies a signal to such a power. The power amplifier is one of the components having the largest power consumption in an internal circuit of the mobile phone. Therefore, it is important to suppress power consumption of the power amplifier, that is, to improve power added efficiency of the power amplifier in order to realize a longtime continuous conversation.

The following will discuss a method of improving power added efficiency of a conventional amplifier in accordance with the accompanied drawings.

The power amplifier is generally constituted by an FET or a bipolar transistor that serves as an amplifying element, a bias circuit for supplying current to the amplifying element, a matching circuit, and a substrate for mounting the transistor and the circuits thereon. In this case, a MOS transistor, an FET made of GaAs, or a heterojunction bipolar transistor made of GaAs is often used as the amplifying element. Further, the power amplifier is generally configured as a multistage amplifier circuit using a plurality of amplifying elements to obtain a desired gain. According to "Basics and Application of MMIC Technology" (written by Yasuyuki Ito and Nao Takaki, published by REALIZE INC.), regarding an output matching circuit connected to the output side of a final amplifying element in a power amplifier, power added efficiency can be improved by using the configuration of FIG. 6.

Figure 6:
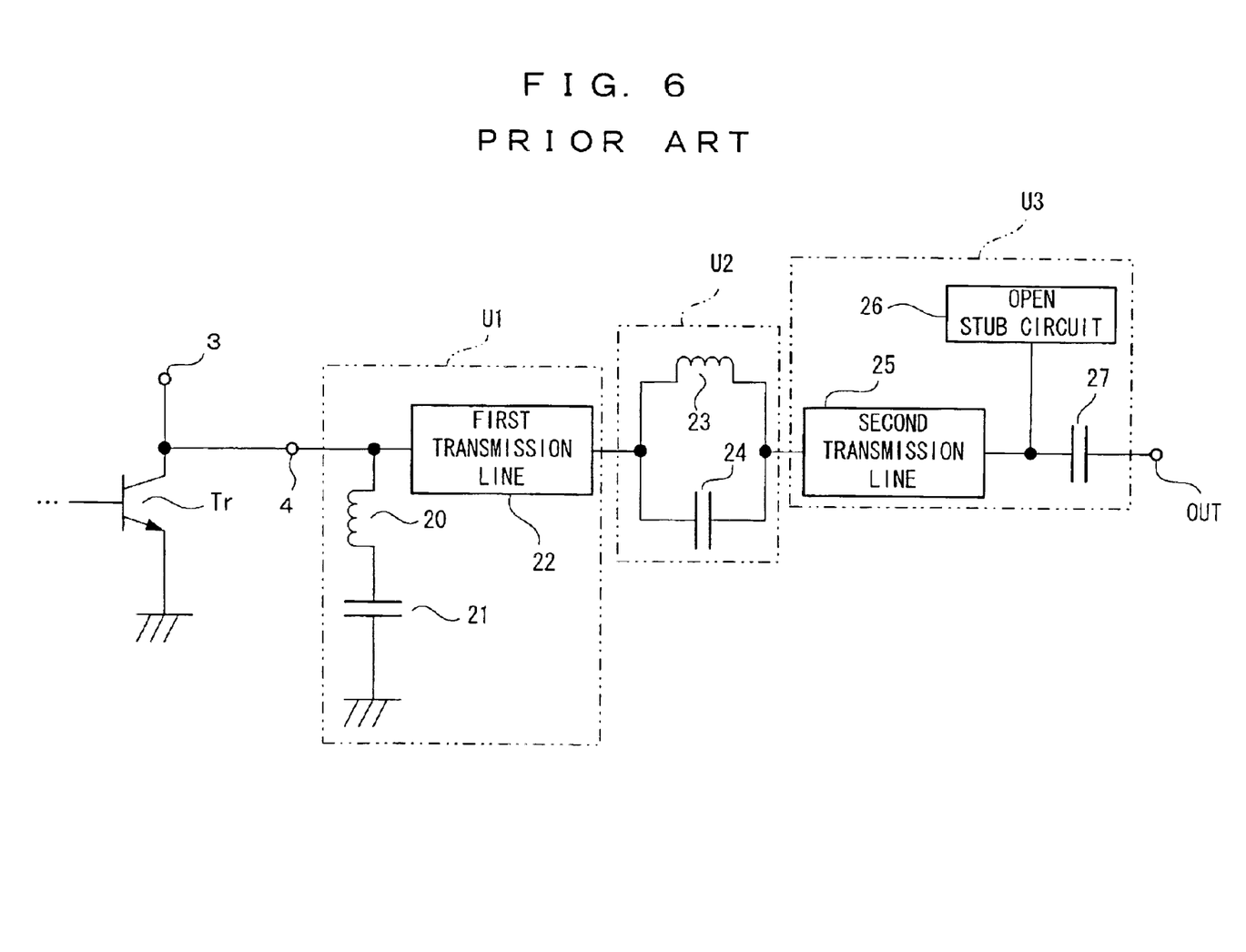
FIG. 6 is a diagram of an output matching circuit for improving power added efficiency of a semiconductor instrument of a convention art.

In FIG. 6, on the output side of a final-stage amplifying element Tr, a first matching circuit U1, a resonant circuit U2, and a second matching circuit U3 are placed in series between the final-stage amplifying element Tr and an antenna terminal OUT. Besides, reference numeral 3 denotes a current supply terminal for the final-stage amplifying element Tr, and reference numeral 4 denotes a radio-frequency signal output terminal of the final-stage amplifying element Tr, An input matching circuit and so on are connected to the base of the final-stage amplifying element Tr.

The first matching circuit U1 is constituted by a first inductor 20, a first capacitor 21, and a first transmission line 22.

The resonant circuit U2 is constituted by a second inductor 23 and a second capacitor 24.

The second matching circuit U3 is constituted by a second transmission line 25, an open stub circuit 2-6, and a third capacitor 27.

In addition to frequency components including a communication signal (hereinafter, referred to as fundamental harmonics), radio-frequency frequency components inputted to the radio-frequency signal output terminal 4 from the final-stage amplifying element Tr include, frequency components twice as large as fundamental harmonics (hereinafter, referred to as 2nd harmonics), frequency components four times as large as fundamental harmonics, and frequency components six times as large as fundamental harmonics, and so on.

Frequency components other than the fundamental harmonics appear in this manner. This is because the final-stage amplifying element Tr is nonlinear and distortion occurs when the amplifying element amplifies a signal. Since frequency components other than the fundamental harmonics are unnecessary, if such frequency components can be suppressed, power consumed by frequency components other than the fundamental harmonics is reduced, thereby increasing power added efficiency of the power amplifier.

It is actually difficult to suppress all the frequency components other than the fundamental harmonics. However, since 2nd harmonics are the largest among the frequency components other than the fundamental harmonics, even when a matching circuit is designed only in consideration of the 2nd harmonics, a considerable effect can be obtained for improving power added efficiency.

The output matching circuit of FIG. 6 is designed in view of the 2nd harmonics. Power added efficiency is improved by the, principle below.

As to the resonant circuit U2 in the previous stage of the second matching circuit U3, values are set to produce resonance to 2nd harmonics, and the second matching circuit U3 does not affect 2nd harmonics. Therefore, matching of 2nd harmonics is determined by the first matching circuit U1, and these values are adjusted so as to have the maximum power added efficiency. Moreover, a matching condition for obtaining the maximum power added efficiency is available for the fundamental harmonics as well, and the second matching circuit U3 is adjusted so as to meet the condition.

In this way, matching is made to the fundamental harmonics and 2nd harmonics, so that power added efficiency is improved as compared with matching only to the fundamental harmonics.

SUMMARY OF THE INVENTION

When a communication method of mobile phones is CDMA and so on, it is necessary to have constant powers of electromagnetic waves reaching a base station from mobile phones. Thus, the mobile phones are controlled in such a way that an output power is low in the vicinity of the base station and the output power is high when away from the base station.

To be specific, a final-stage amplifying element Tr has the same amplification factors during a high-output operation and during a low-output operation, and control is performed in such a way that a radio-frequency input power inputted to the base of the final-stage amplifying element Tr during a low-output operation is lower than the radio-frequency input power inputted to the base of the final-stage amplifying element Tr during a high-output operation. The same condition may be required in the other communication methods.

Figure 7:
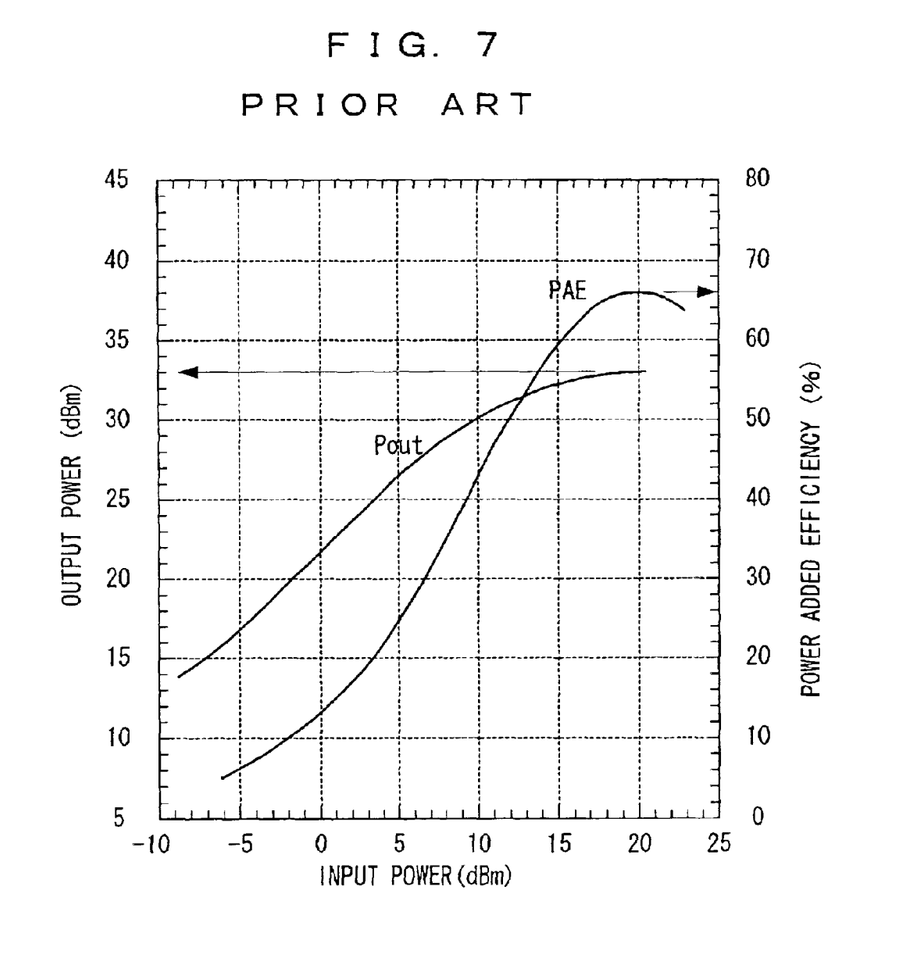
FIG. 7 is a characteristic diagram showing power added efficiency relative to an output power according to the conventional art.

In a conventional configuration of FIG. 6, when an output power is low, power added efficiency is reduced as shown in FIG. 7.

FIG. 7 shows an output power and a power added efficiency relative to an input power of a power amplifier when the power added efficiency is improved in the configuration of FIG. 6.

A representative characteristic is that the power added efficiency reaches the maximum efficiency of about 66% when the output power is about 33 dBm. In this way, the characteristic of the power added efficiency relative to the output power is that the highest value is obtained with a specific output power, and such highest value of the output power is determined substantially by the size of a final-stage amplifying element in the power amplifier (a gate width when the amplifying element is an FET and an emitter area when it is a bipolar transistor). As the output power decreases, the power added efficiency also decreases monotonously. That is, when the output power is low, the power added efficiency is reduced.

To be specific, the final-stage amplifying element Tr is constant in amplification factor during a high-output operation and during a low-output operation, and control is performed in such a way that a radio-frequency input power inputted to the base of the final-stage amplifying element Tr during a low-output operation is lower than the radio-frequency input power inputted to the base of the final-stage amplifying element Tr during a high-output operation. The same condition may be required in the other communication methods.

The present invention has an object to provide a semiconductor instrument such that the power added efficiency is expected to improve during a low-output operation, and when used in a mobile phone, power consumption of the power amplifier is suppressed to realize longtime continuous conversation.

A semiconductor instrument of the present invention for supplying a radio-frequency input signal to each of input circuits in a plurality of transistors, connecting output circuits of the plurality of transistors in parallel, and retrieving a radio-frequency output signal with amplified power is characterized in that during a low-output operation in which a radio-frequency output signal has output power equal to or lower than a threshold power, an amplifying operation is turned off for some of the plurality of transistors.

During a low-output operation in which a radio-frequency output signal has a low output power, a circuit for turning off the amplifying operation of the transistors turns off an input bias of the transistors of which amplifying operation is turned off during a low-output operation. Or a radio-frequency input signal is supplied via a radio-frequency switch to an input of the transistor of which amplifying operation is turned off during a low-output operation in which the radio-frequency output signal has a low output power, and the radio-frequency switch is turned off during the low-output operation in which the radio-frequency output signal has a low output power. Or a radio-frequency switch is interposed in series with a circuit for supplying current to output circuits of the transistors of which amplifying operation is turned off during the low-output operation in which the radio-frequency output signal has a low output power, and the radio-frequency switch is turned off during the low-output operation in which the radio-frequency output signal has a low output power.

DESCRIPTION OF THE EMBODIMENTS

The following will discuss a radio-frequency amplifier circuit in accordance with embodiments of the present invention.

(Embodiment 1)

Figure 1:
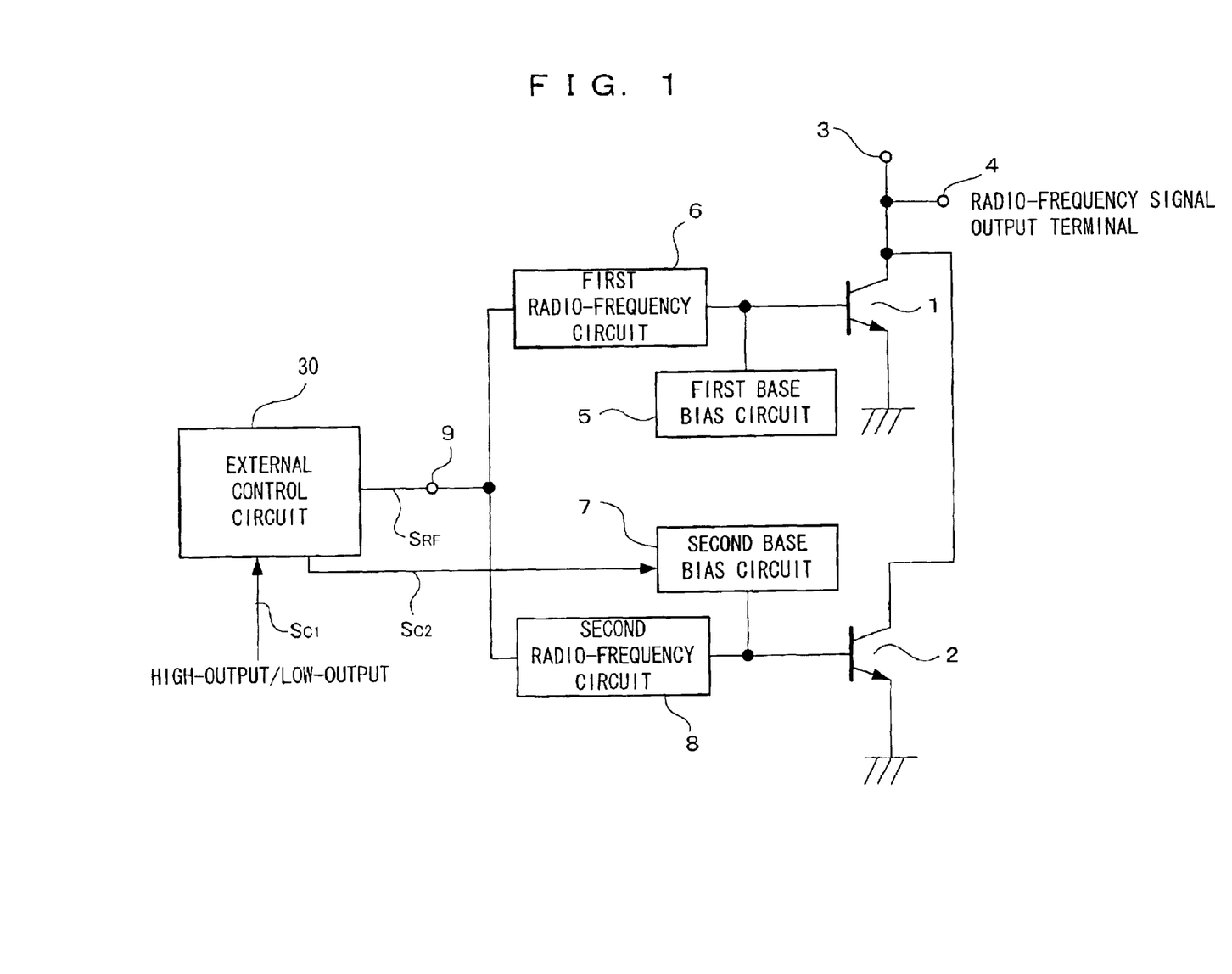
FIG. 1 is a structural diagram showing a semiconductor instrument according to (Embodiment 1) of the present invention.

FIG. 1 shows (Embodiment 1) of the present invention.

A semiconductor instrument of a mobile phone is configured such that first and second transistors 1 and 2 for power amplification have output circuits connected in series to obtain a large output power.

The first and second transistors 1 and 2 for power amplification are fed with current from a current supply terminal 3, and a radio-frequency power is derived from a radio-frequency signal output terminal 4 and is outputted to an antenna via an output matching circuit (not shown). A conventional output matching circuit of FIG. 6 comprising first and second matching circuits U1 and U3 and a resonant circuit U2 is used as such an output matching circuit.

The inputs of the first and second transistors 1 and 2 for power amplification have the configurations below.

The first transistor 1 for power amplification is fed with base current from a first base bias circuit 5, and the second transistor 2 for power amplification is fed with base current from a second base bias circuit 7. Further, the base of the first transistor 1 for power amplification is connected to a radio-frequency signal input terminal 9 via a first radio-frequency circuit 6 which is a part of an input matching circuit, and the base of the second transistor 2 for power amplification is connected to the radio-frequency signal input terminal 9 via a second radio-frequency circuit 8 which is a part of an input matching circuit.

The radio-frequency signal input terminal 9 is fed with a radio-frequency input signal $S_{RF}$ from an external control circuit 30. The radio-frequency signal input terminal 9 outputs a radio-frequency input signal $S_{RF}$ and identifies a high-power/low-power signal Sc1 indicating whether a mobile phone is close to or far from a base station. When the mobile phone is close to the base station and only a low-output operation is necessary, in which output power of a radio-frequency output signal from the mobile phone is equal to or lower than a threshold power, an instruction is provided by a control signal Sc2 to turn off an amplifying operation of at least the transistor 1 of the first and second transistors 1 and 2 for power amplification.

To be specific, in the case of the low-output operation in which a radio-frequency output signal has a low output power, the output of a second base bias circuit 7 is turned off. The second base bias circuit 7 supplies an input bias of the second transistor 2 for power amplification that turns off its amplifying operation during a low-output operation.

The total of an emitter area of the first transistor 1 for power amplification and an emitter area of the second transistor 2 for power amplification needs to be set at a value large enough to obtain the maximum output power defined by the communication standard of the mobile phone. Further, the total of the emitter areas is set in such a manner as to obtain the maximum power added efficiency while satisfying a characteristic (characteristic such as distortion) specified by the communication standard at the maximum output power.

With such a configuration, when a mobile phone is far from a base station and an operation requires high output to such a degree that the output power of a radio-frequency output signal exceeds a threshold power, a low-output operation is performed according to a parallel operation of the first and second transistors 1 and 2 for power amplification. When a mobile phone is close to a base station and a low-output operation is performed with a radio-frequency output signal having output power being equal to or lower than the threshold power, the second transistor 2 for power amplification is turned off and a low-output operation is performed according to an isolated operation of the first transistor 1 for power amplification.

Therefore, output power can be obtained only by the first transistor 1 for power amplification and power consumption of the second transistor 2 for power amplification is set at 0, so that power added efficiency during a low-output operation is improved. However, an emitter area of the first transistor 1 for power amplification is set at a value large enough to obtain the threshold power.

Besides, in the above example, in the case of the low-output operation, the operation of the second base bias circuit 7 is stopped. The following arrangement is also applicable the control signal Sc2 is caused to interrupt the connection between the second base bias circuit 7 and the base of the second transistor 2 for power amplification during a low-output operation to stop the operation of the second transistor 2 for power amplification.

Besides, "3.5V Operation Amplifier MMIC Utilizing SrTiO₃ Capacitors for Wide-Band CDMA Cellular Phones", collective treatise C-10-23, the Institute of Electronics, Information and Communication Engineers, 1998 discloses that transistors for power amplification are operated in parallel and the input biases of all the transistors operating in parallel are changed at the same time when output power is reduced.

However, the parallel operation of the transistors for power amplification and the simultaneous change in input bias cannot improve power added efficiency as with the embodiments of the present invention for the following reason:

The above-described case is equivalent to a change in input bias of a single transistor for power amplification that is equal in size to the combination of two transistors operating in parallel for power amplification. The above paper describes dependence of power added efficiency on output power when the input bias of a transistor for power amplification is changed. According to the above described document, even when input bias is changed during a low-output operation, power added efficiency can be improved only by 5% at the maximum. Therefore, in this case, power added efficiency cannot be largely improved.

(Embodiment 2)

Figure 2:
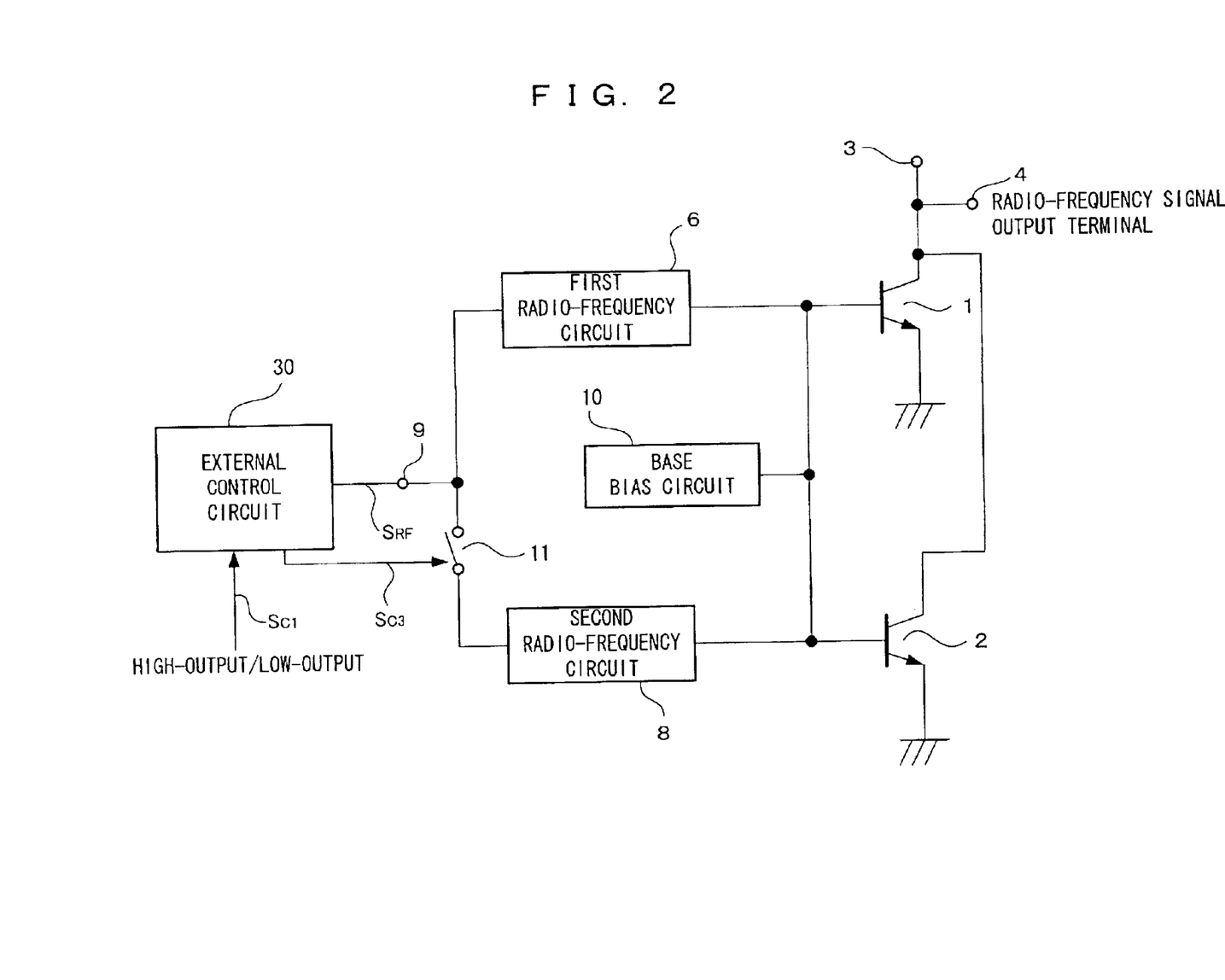
FIG. 2 is a structural diagram showing a semiconductor instrument according to (Embodiment 2) of the present invention.

FIG. 2 shows (Embodiment 2) of the present invention. (Embodiment 2) is different from (Embodiment 1) only in that base biases of first and second transistors for power amplification are applied from a common base bias circuit 10 and a radio-frequency switch 11 for controlling passage of a radio-frequency signal is provided between the input of a second radio-frequency circuit 8 and a radio-frequency signal input terminal 9.

With this configuration, when a power outputted from a radio-frequency signal output terminal 4 is equal to or higher than a threshold power, the radio-frequency switch 11 is closed. When the power is equal to or lower than the threshold power, the first radio-frequency switch 11 is opened and no signal is supplied to the second transistor 2 for power amplification. At this point, power consumed by the second transistor 2 for power amplification is only bias current supplied from a current supply terminal 3 and the base bias circuit 10. Thus, power added efficiency can be improved with power lower than the threshold power.

EXAMPLE 1

Figure 3:
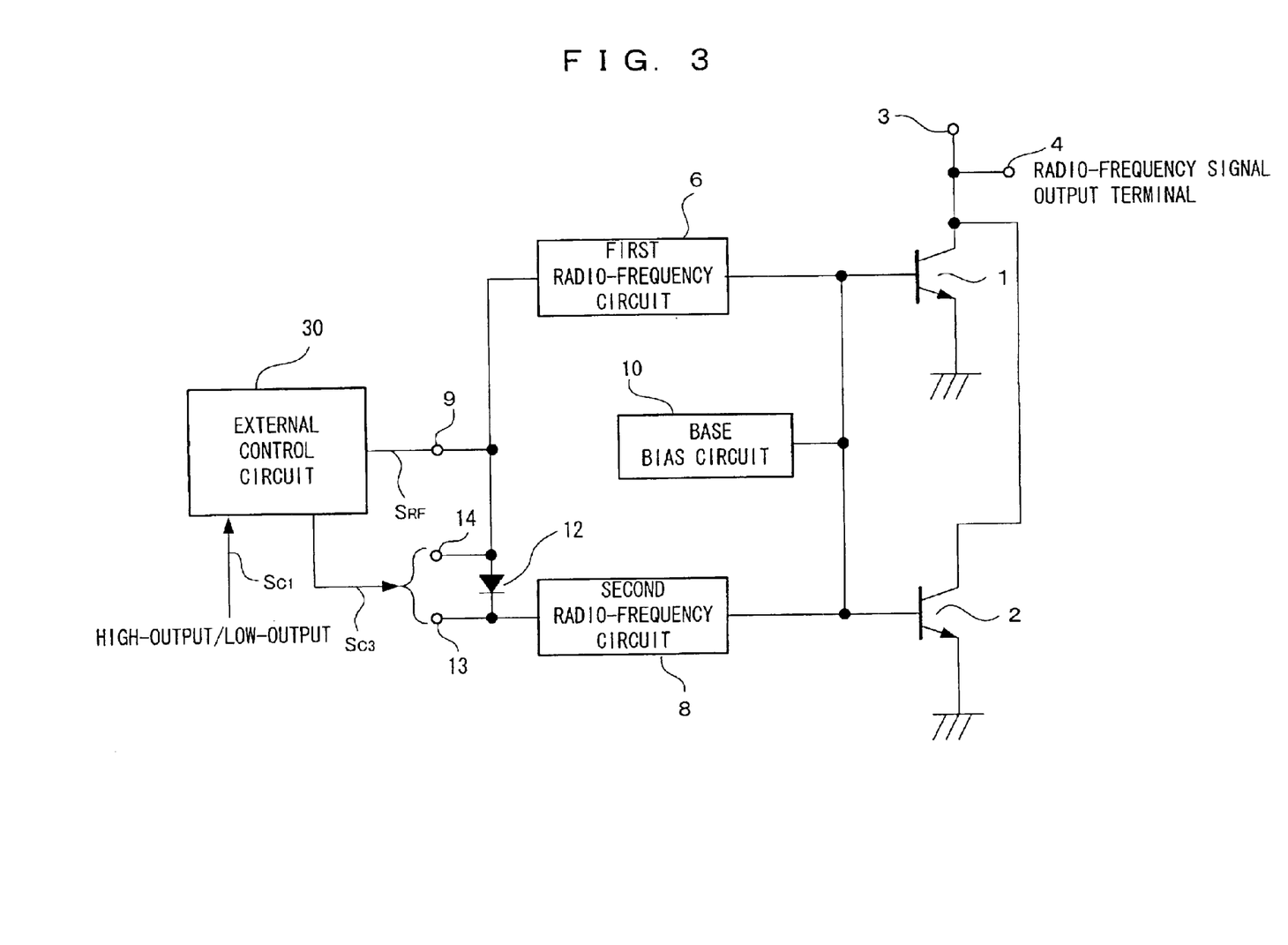
FIG. 3 is a structural diagram showing a semiconductor instrument according to (Example 1) in (Embodiment 2)

FIG. 3 shows a specific example in which a radio-frequency switch 11 is formed by a diode 12. A voltage difference between a first bias terminal 13 and a second bias terminal 14 is set at or higher than a conduction voltage of a diode 12. Thus, the same operation is performed as that of a closing state of the radio-frequency switch 11. Further, when the voltage difference is set lower than a conduction voltage of the first diode 12, the same operation is performed as that of an opening state of the first radio-frequency switch 11.

Additionally, as to first and second radio-frequency circuits 6 and 8 of (Example 1), at least the first radio-frequency circuit 6 has a circuit configuration in, which passage of direct current is interrupted, to be specific, a radio-frequency input signal is supplied to the post stage via a coupling capacitor so as to prevent current voltage applied to the first and second bias terminals 13 and 14 from affecting the operation of the first transistor 1 for power amplification.

A radio-frequency amplifier circuit of FIG. 3 may be formed on the same semiconductor substrate in the same forming process as that of the first and second transistors 1 and 2 for power amplification.

Moreover, the diode 12 may be replaced with a transistor having a base and a collector short-circuited therein, or the diode 12 may be formed by using the same material as that of a base/collector junction of a transistor.

(Embodiment 3)

Figure 4:
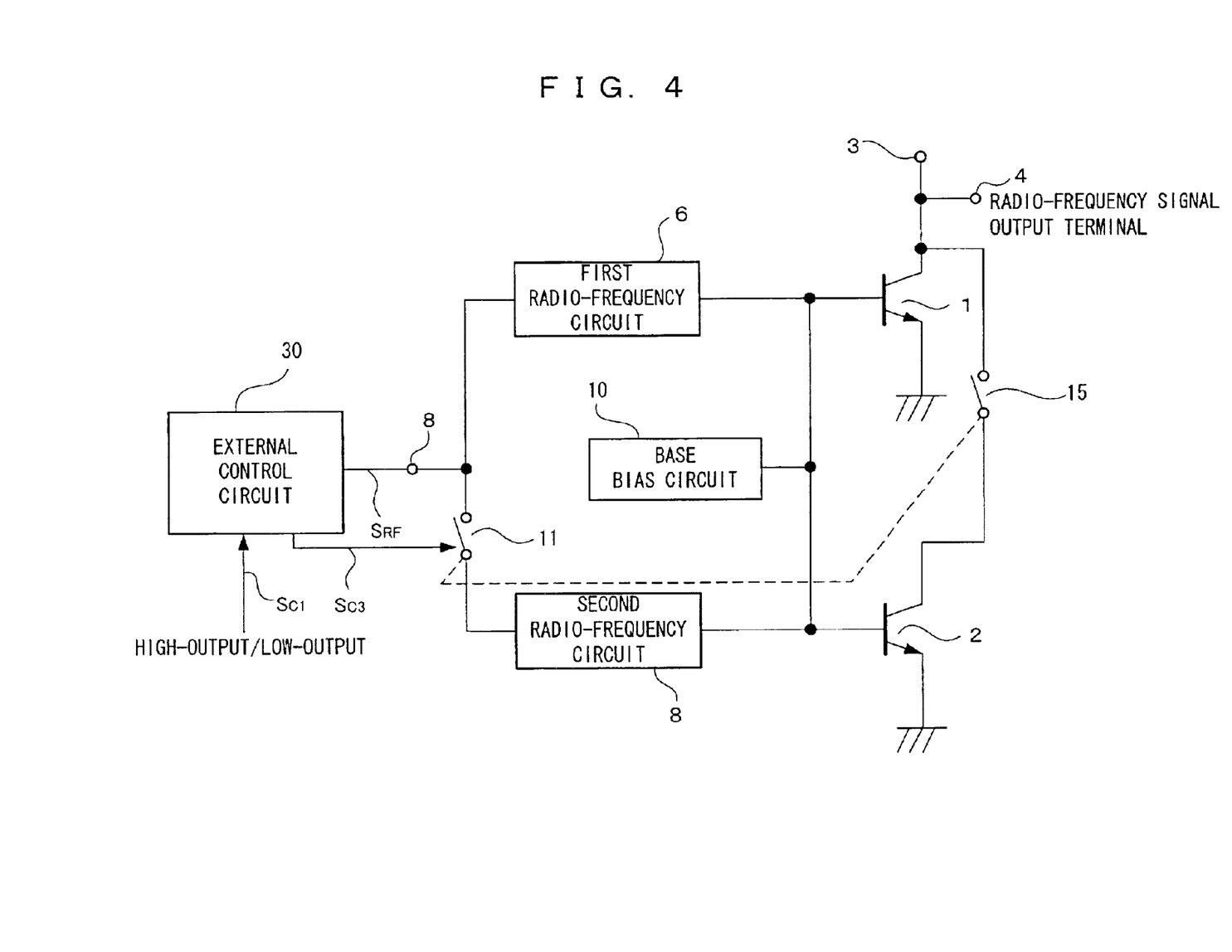
FIG. 4 is a structural diagram showing a semiconductor instrument according to (Embodiment 3) of the present invention.

FIG. 4 shows (Embodiment 3) of the present invention. (Embodiment 3) is different from FIG. 2 only in that a radio-frequency switch 15 is added on a current feed path from a current supply terminal 3 to a second transistor 2 for power amplification.

With this configuration, when a power outputted from a radio-frequency signal output terminal 4 is equal to or higher than a threshold power, radio-frequency switches 11 and 15 are closed. In the case of a low-output operation, the radio-frequency switches 11 and 15 are opened and no signal is supplied to the second transistor 2 for power amplification. At this point, power consumed by the second transistor 2 for power amplification is only bias current supplied from the current supply terminal 3 and a base bias circuit 10. Thus, power added efficiency during a low-output operation is improved.

EXAMPLE 2

Figure 5:
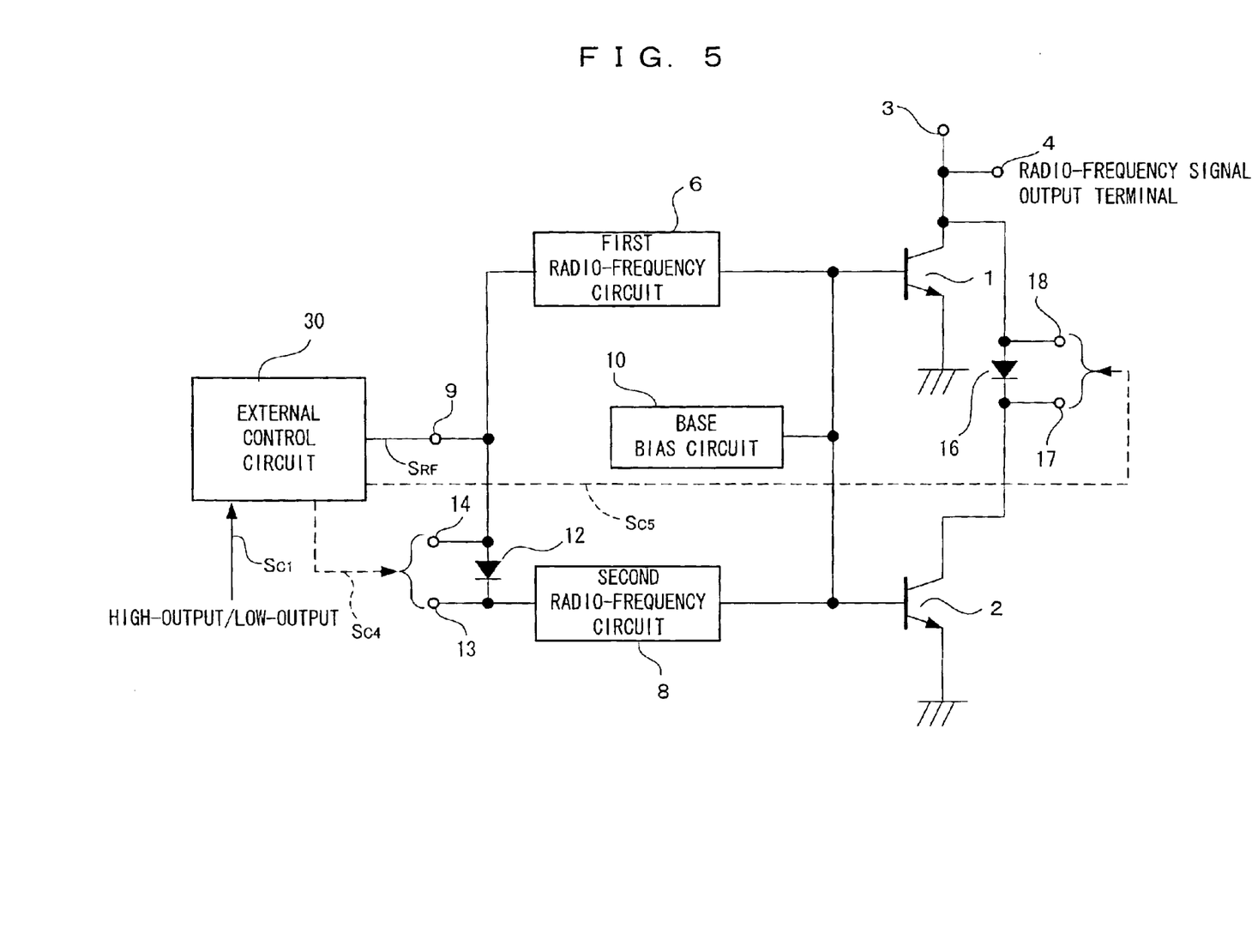
FIG. 5 is a structural diagram showing a semiconductor instrument according to (Example 2) in (Embodiment 3)

FIG. 5 shows a specific example in which a radio-frequency switch 11 is formed by a diode 12 and a radio-frequency switch 15 is formed by a diode 16.

A voltage difference between a first bias terminal 13 and a second bias terminal 14 is set at or higher than a conduction voltage of a diode 12. Thus, the same operation is performed as that of a closing state of the radio-frequency switch 11. Further, the voltage difference is set lower than the conduction voltage of the diode 12. Thus, the same operation is performed as that of an opening state of the first radio-frequency switch 11. A voltage difference between a third bias terminal 17 and a fourth bias terminal 18 is set at or higher than a conduction voltage of a diode 16. Thus, the same operation is performed as that of a closing state of the radio-frequency switch 15. Further, the voltage difference is set lower than the conduction voltage of the first diode 16. Thus, the same operation is performed as that of an opening state of the radio-frequency switch 15.

In the above-described embodiments, the first and second transistors 1 and 2 for power amplification are caused to perform low-output operations according to two parallel operations, and the operation of the second transistor 2 for power amplification is turned off during a low-output operation. Power added efficiency during a low-output operation is expected to increase as compared with the conventional art also by the following configuration: the bias of the second transistor 2 for power amplification is set lower than that of a low-output operation instead of turning off the input bias of the second transistor 2 for power amplification during a low-output operation.

In the above-described embodiments, the first and second transistors 1 and 2 for power amplification are caused to perform high-output operations according to two parallel operations, and the operation of the second transistor 2 for power amplification is turned off during a low-output operation. The same effect can be obtained also by the following configuration: three or more transistors for power amplification are provided that perform a parallel operation during a high-output operation, amplifying operations are turned off for some of the plurality of transistors, or input bias is set lower than that of the high-output operation for some of the plurality of transistors.

As described above, a semiconductor instrument of the present invention, in which radio-frequency input signals are supplied respectively to the input circuits of a plurality of transistors and the output circuits of the plurality of transistors are connected in parallel to retrieve a radio-frequency output signal amplified in power, is characterized in that during a low-output operation in which output power of the radio-frequency output signal is equal to or lower than;a threshold power, an amplifying operation is turned off for some of the plurality of the transistors, or during the low-output operation, input bias is set lower than that of a high-output operation for some of the plurality of transistors. Or a radio-frequency input signal is supplied via a radio-frequency switch to the input of the transistor which turns off an amplifying operation during a low-output operation and an output power of the radio-frequency output signal turns off the radio-frequency switch during a low-output operation. Thus, it is expected that power added efficiency improves during a low-output operation. When such a semiconductor instrument is applied to a mobile phone, it is possible to suppress power consumption of a power amplifier, thereby realizing longtime continuous conversation.

What is claimed is:

1. A semiconductor instrument comprising:

a plurality of transistors each having a plurality of input and output circuits;

means for supplying a radio-frequency input signal to each of the input circuits;

means for connecting output circuits of the plurality of transistors in parallel;

means for retrieving a radio-frequency output signal with amplified power; and a radio frequency switch for supplying a radio-frequency input signal to an input of a first transistor among said plurality of transistors, said first transistor for having an amplifying operation turned off during low-output operation in which the radio-frequency output signal has low output power, and wherein the radio-frequency switch is for being turned off during low-output operation in which the radio-frequency output signal has low output power.

2. A semiconductor instrument comprising:

a plurality of transistors each having a plurality of input and output circuits;

means for supplying a radio-frequency input signal to each of the input circuits;

means for connecting output circuits of the plurality of transistors in parallel;

means for retrieving a radio-frequency output signal with amplified power;

a radio-frequency switch interposed in series with a circuit for supplying a current to an output circuit of a first transistor among said plurality of transistors, said first transistor for having an amplifying operation turned off during low-output operation in which the radio-frequency output signal has low output power, and wherein the radio-frequency switch is for being turned off during low-output operation in which the radio-frequency output signal has low output power.

3. A semiconductor instrument comprising:

a plurality of transistors each having a plurality of input and output circuits;

means for supplying a radio-frequency input signal to each of the input circuits;

means for connecting output circuits of the plurality of transistors in parallel;

means for retrieving a radio-frequency output signal with amplified power; and a first radio frequency switch for supplying a radio-frequency input signal to an input of a first transistor among said plurality of transistors, said first transistor for having an amplifying operation turned off during low-output operation in which the radio-frequency output signal has low output power;

a second radio-frequency switch interposed in series with a circuit for supplying current to an output circuit of the first transistor for having an amplifying operation turned off during low-output operation in which the radio-frequency output signal has low output power, and wherein the first and second radio-frequency switches are for being turned off during low-output operation in which the radio-frequency output signal has low output power.

4. The semiconductor instrument according to claim 1, further comprising a coupling capacitor, wherein said radio-frequency switch comprises a diode switch, and the coupling capacitor is for supplying a radio-frequency input signal to an input of the first transistor having an amplifying operation turned off during low-output operation in which the radio-frequency output signal has the output power, thereby preventing application of current bias voltage for switching the diode switch.

5. The semiconductor instrument according to claim 1, further comprising a coupling capacitor, wherein said first and second radio-frequency switches comprise diode switches, and the coupling capacitor is for supplying a radio-frequency input signal to an input of the first transistor having an amplifying operation turned off during the low-output operation in which the radio-frequency output signal has low output power, thereby preventing application of current bias voltage for switching the diode switches.

* * * * *